(12) United States Patent
Zhang et al.

(10) Patent No.: US 11,869,774 B2
(45) Date of Patent: Jan. 9, 2024

(54) METHOD FOR IMPROVING ETCHING RATE OF WET ETCHING

(71) Applicant: CHANGXIN MEMORY TECHNOLOGIES, INC., Hefei (CN)

(72) Inventors: Nannan Zhang, Hefei (CN); Yen-Teng Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 219 days.

(21) Appl. No.: 17/445,299

(22) Filed: Aug. 17, 2021

(65) Prior Publication Data

US 2022/0102157 A1 Mar. 31, 2022

Related U.S. Application Data

(63) Continuation of application No. PCT/CN2021/099825, filed on Jun. 11, 2021.

(30) Foreign Application Priority Data

Sep. 25, 2020 (CN) .......................... 202011024298.1

(51) Int. Cl.
*H01L 21/311* (2006.01)
*C09K 13/08* (2006.01)
*H01L 21/67* (2006.01)

(52) U.S. Cl.
CPC ........ *H01L 21/31111* (2013.01); *C09K 13/08* (2013.01); *H01L 21/67086* (2013.01)

(58) Field of Classification Search
None
See application file for complete search history.

(56) References Cited

U.S. PATENT DOCUMENTS

| 5,560,838 | A | * | 10/1996 | Allies | ...................... | C01G 3/02 |
| | | | | | | 216/93 |
| 6,254,720 | B1 | * | 7/2001 | Shih | ...................... | B08B 9/0325 |
| | | | | | | 134/104.1 |

(Continued)

FOREIGN PATENT DOCUMENTS

| CN | 102569015 | A | 7/2012 |
| CN | 102828184 | A | 12/2012 |

(Continued)

OTHER PUBLICATIONS

Machine English translation of CN 102569015; Jul. 11, 2012 (Year: 2012).*

(Continued)

*Primary Examiner* — Shamim Ahmed
(74) *Attorney, Agent, or Firm* — Syncoda LLC; Feng Ma

(57) ABSTRACT

A method for improving an etching rate of wet etching involves an etching reaction chamber used for etching work. The etching reaction chamber is connected with an etchant supply mechanism. The etchant supply mechanism is connected with a purified water supply mechanism. The purified water supply mechanism injects purified water into the etchant supply mechanism according to a change range of pH of the etchant in the etchant supply mechanism to ensure that a hydrogen ion concentration and a fluoride ion concentration of the etchant in the etchant supply mechanism are stable.

13 Claims, 8 Drawing Sheets

(56) References Cited

U.S. PATENT DOCUMENTS

| | | | |
|---|---|---|---|
| 7,083,741 B2 * | 8/2006 | Stadler | H01L 21/67086 216/99 |
| 8,889,563 B2 | 11/2014 | Lim | |
| 8,945,939 B2 | 2/2015 | Tseng et al. | |
| 2005/0072524 A1 * | 4/2005 | Mueller | H01L 21/31053 257/E21.244 |
| 2008/0188084 A1 * | 8/2008 | Feijoo | H01L 21/30604 257/E21.214 |
| 2012/0196445 A1 | 8/2012 | Lim | |
| 2012/0326076 A1 * | 12/2012 | Arndt | H01L 21/31111 252/79.3 |
| 2014/0073060 A1 | 3/2014 | Tseng et al. | |

FOREIGN PATENT DOCUMENTS

| | | |
|---|---|---|
| CN | 104903996 A | 9/2015 |
| CN | 106215798 A | 12/2016 |
| CN | 105742213 B | 3/2019 |
| KR | 100860269 B1 | 9/2008 |

OTHER PUBLICATIONS

Machine Englilsh Translation of CN 106215798; Dec. 14, 2016 (Year: 2016).*

* cited by examiner

METHOD FOR IMPROVING ETCHING RATE OF WET ETCHING

CROSS-REFERENCE TO RELATED APPLICATIONS

This application is a continuation of International Application No. PCT/CN2021/099825 filed on Jun. 11, 2021, which claims priority to Chinese Patent Application No. 202011024298.1, filed on Sep. 25, 2020. The disclosures of these applications are hereby incorporated by reference in their entirety.

BACKGROUND

Buffered oxide etchant (BOE), also known as hydrogen fluoride (HF) buffer or BHF buffer, is a wet etchant used for microfabrication and is widely used in cleaning and etching oxides in the semiconductor industry. The BOE is generally prepared by mixing hydrogen fluoride (HF) and ammonium fluoride ($NH_4F$) with water and a surfactant in different proportions. It is mainly used to etch a dielectric film, such as a silicon dioxide ($SiO_2$) thin film or a silicon nitride ($Si_3N_4$) thin film in a groove of a wafer.

SUMMARY

The present application relates generally to the technical field of wet etching, and more specifically to a method for improving an etching rate of wet etching.

With respect to the above-mentioned problems, the disclosure provides a method for improving an etching rate of wet etching.

In order to achieve the above objective, the present disclosure provides the following technical solutions.

A method for improving an etching rate of wet etching is provided, and includes the following operations. The method is used in an etching reaction chamber for etching work. The etching reaction chamber is connected with an etchant supply mechanism. The etchant supply mechanism is connected with a purified water supply mechanism. The purified water supply mechanism injects purified water into the etchant supply mechanism according to a change range of pH of the etchant in the etchant supply mechanism to ensure that a hydrogen ion concentration and a fluoride ion concentration of the etchant in the etchant supply mechanism are stable.

Types and amounts of the surfactants are not particularly limited in the present disclosure. The types and amounts of the surfactants commonly used in the field of BOE may be used.

DETAILED DESCRIPTION

Figure 1:
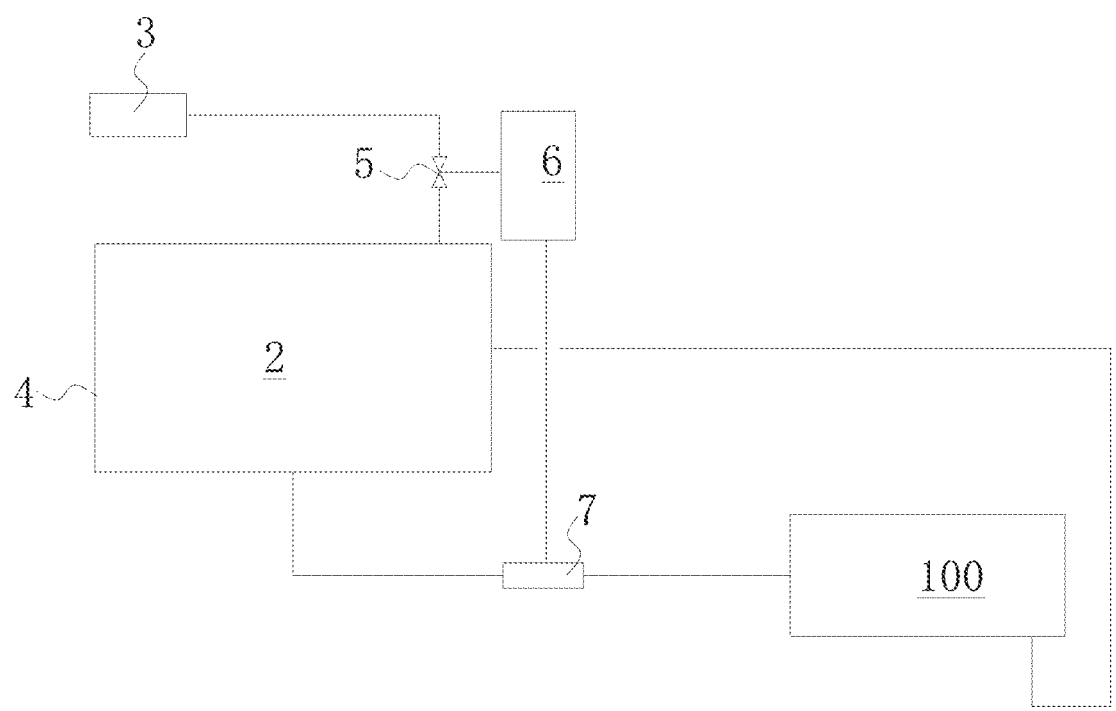
FIG. 1 schematically illustrates a structure of a device used in a method for improving an etching rate of wet etching of the present disclosure.

In order to make those skilled in the art better understand solutions of the present disclosure, the technical solutions in the embodiments of the present disclosure will be described clearly and completely with reference to the accompanying drawing In a process of wet etching, the BOE is generally placed into an etchant supply mechanism before starting the etching. Then, the BOE is transported to an etching reaction chamber through the etchant supply mechanism. In order to reduce the cost, the BOE reaction solution in the etching reaction chamber is generally collected and returned, after the wafer is etched, to the etchant supply mechanism for recycling. As a wafer throughput in the etching reaction chamber increases, the BOE reaction solution recycled in the etchant supply mechanism will also increase. In actual use, the cost can be reduced at a certain extent by recycling the BOE reaction solution. However, as the wafer throughput in the etching reaction chamber increases, the etching rate will become higher and higher. If the BOE is not replaced in time, there will be a technical problem that the etching rate cannot be accurately controlled as the etching rate gradually increases with the increase of the wafer throughput. In the related art, in order to control the etching rate, the BOE needs to be replaced regularly. In addition, the chemical consumption is relatively high. Generally, the BOE needs to be replaced once a day, which will cause frequent shutdowns and lower production efficiency.

The disclosure directs to the problem that due to the recycling of a BOE reaction solution in a wet etching process, the etching rate rapidly increases with the increase of the wafer throughput in an etching reaction chamber 100. It is found that when the BOE is placed in the etching reaction chamber 100, $NH_4F$ is easily decomposed when heated, into ammonia ($NH_3$) and HF. $NH_3$ then dissolves in water immediately and undergoes an electrolytic reaction to generate $OH^-$. Si of the wafer is then corroded by $OH^-$ to generate $H_2$. $H_2$ is accumulated on the surface of the wafer to hinder etching, forming point defects. $OH^-$ increases the degree of corrosion of Si. At the same time, the electrolysis reaction of $NH_3$ dissolved in water and the process that Si is corroded by OH—refer to the consumption of water ($H_2O$). As hydrogen and fluoride ions are generated continuously via the ionization of $NH_4F$ in the etching reaction process, and water is consumed continuously in the etching reaction process, the hydrogen ion concentration and the fluoride ion concentration in the BOE reaction solution become greater and greater, the recycling of the BOE reaction solution leads to higher and higher hydrogen ion and fluoride ion concentrations of the etchant in the etchant supply mechanism, which increases the etching rate too fast. As the wafer throughput increases, the reaction time is prolonged. Therefore, the hydrogen ion concentration and the fluoride ion concentration of the etchant are getting higher and higher, the etching rate increases faster and faster, and the etching rate will be greater and greater, and thus causing that an oxide thin film etched within the same time is thicker and thicker to affect the product yield. Taking $SiO_2$ oxide film as an example, the etching rate to $SiO_2$ may increase with the increase of the weight percentage of HF in the etchant. The etching rate to $SiO_2$ may also increase with the increase of a weight ratio of $NH_4F$ to HF in the BOE and the rise of temperature. On this basis, the present disclosure provides a method for improving an etching rate of wet etching by controlling the hydrogen ion concentration and the fluoride ion concentration of the etchant through monitoring pH of the etchant.

The etchant used in examples of the present disclosure is the BOE that is composed of water, ammonium fluoride, hydrogen fluoride, and a surfactant. A commercially available product may be used. Optionally, ammonium fluoride in the etchant is 19.7%-20.3% by weight, and hydrogen fluoride is 3.8%-4.2% by weight. Types and amounts of the surfactants are not particularly limited in the present disclosure. The types and amounts of the surfactants commonly used in the field of BOE may be used. Optionally, the surfactant is a nonionic surfactant or an anionic surfactant, etc., such as one or more of an alkyl sulfonic acid surfactant, a fluorohydroalkyl carboxylic acid surfactant, a fluorine-containing carboxylic acid surfactant or a fluorinated carboxylate surfactant. Further, the surfactant may be one or more selected from $C_4F_9O(CF_3)COONH_4$, sodium lauryl ether sulfate (AES sodium salt), α-alkenyl sulfonate sodium salt (AOS sodium salt) and 6501 surfactant. Specifically, the surfactant is composed of 28 wt % of AES sodium salt, 30 wt % of AOS sodium salt, or 30 wt % of 6501. The amount of surfactant is 0.8 wt %-1.2 wt % in the etchant, and the balance is water. For substances, all commercially available products can be used.

Reaction formulas of decomposition of the $NH_4F$ in the BOE when heated are as follows.

$$NH_4F \rightarrow NH_3 + HF \quad (1)$$

$$NH_3 + H_2O \rightarrow NH_4^+ + OH^- \quad (2)$$

$$Si + 2OH^- + H_2O \rightarrow SiO_3^- + 2H_2 \quad (3)$$

It is found that factors affecting the decomposition of $NH_4F$ include temperature, light wavelength, and reaction time. Specifically, the temperature is higher, the $NH_4F$ is easier to decompose. Short-wavelength light used in the related art has high energy, accelerating the decomposition of $NH_4F$. A higher wafer throughput makes longer reaction time and more $NH_3$ decomposed. Therefore, more hydrogen ions and fluoride ions are generated by ionization. In addition, water is consumed in the etching reaction process, which leads to greater and greater hydrogen ion concentration and fluoride ion concentration, resulting in faster increase of the etching rate. In the related art, in order to control the etching rate, the BOE needs to be replaced by fresh one regularly. Taking a wafer throughput being 30 pcs per day as an example, the BOE generally needs to be replaced once a day (24 hours), which not only consumes a lot of chemicals, but also increases the cost, resulting in frequent shutdown and reducing the production efficiency.

Figure 4:
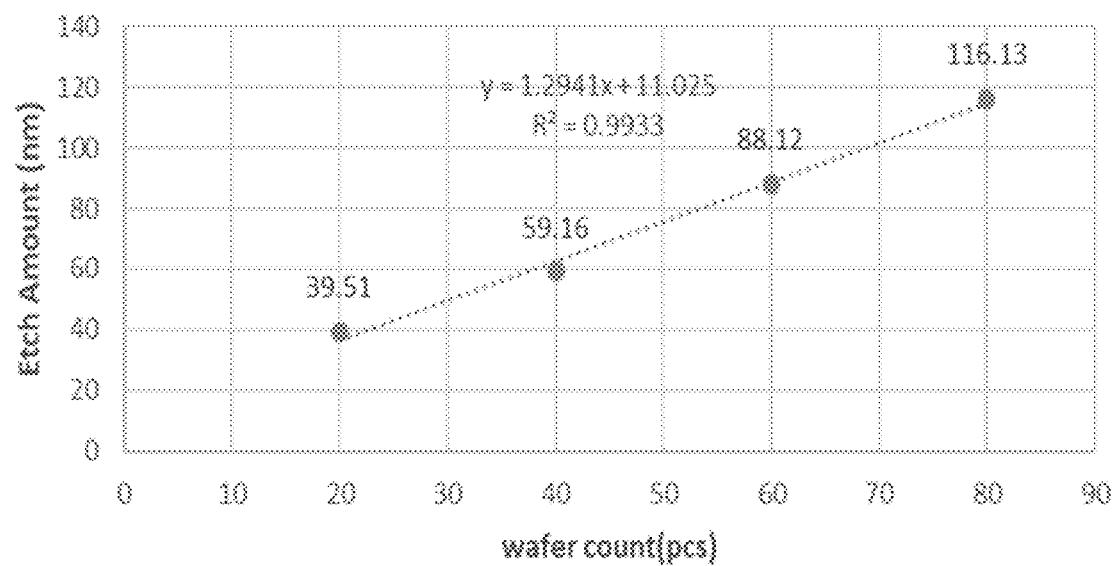
FIG. 4 illustrates a relationship between an etching rate and the wafer throughput of wet etching that is not improved.
Figure 7:
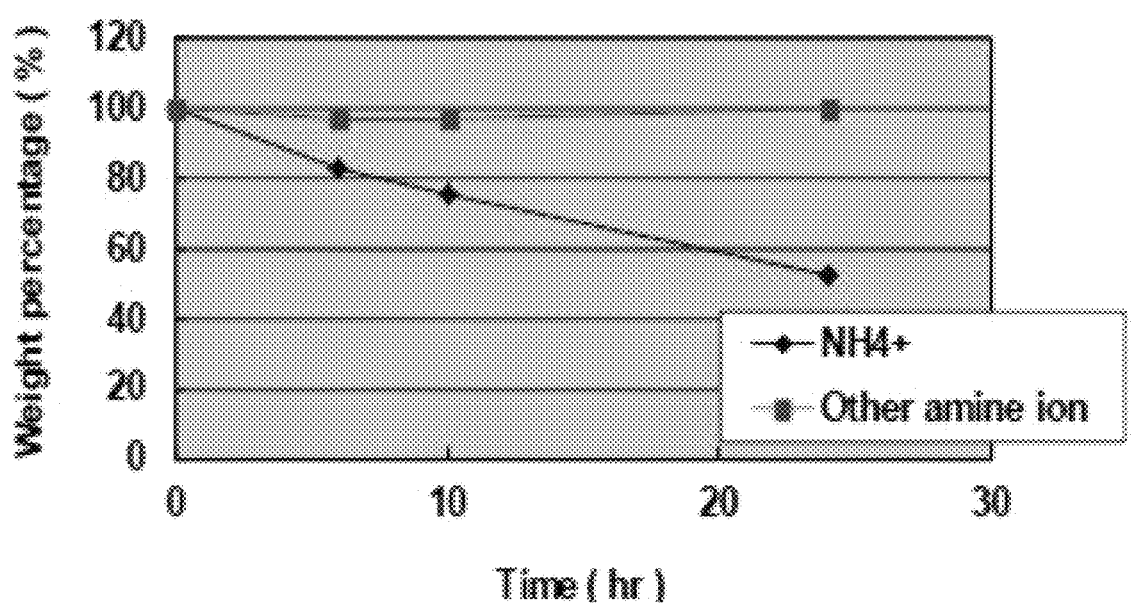
FIG. 7 illustrates a graph of ion concentrations of an etchant as a function of time wet etching (30 wafers are treated) that is not improved.
Figure 8:
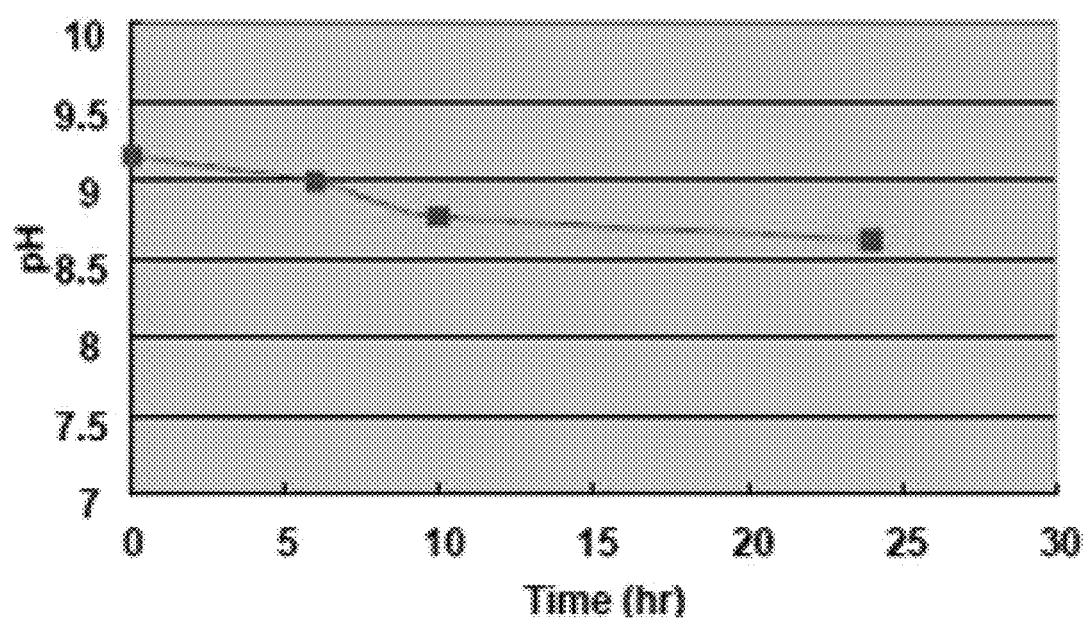
FIG. 8 illustrates a graph of pH of an etchant as a function of time in wet etching (30 wafers are treated) that is not improved.

The method of related art, i.e., wet etching that is not improved may be used. A BOE reaction solution continuously returns to an etchant supply mechanism 2 during wet etching, and the BOE reaction solution includes thermally decomposed products of the $NH_4F$, which will cause the hydrogen ion concentration and the fluoride ion concentration of the etchant in the etchant supply mechanism 2 to be greater and greater. pH is dropped. Taking the wafer throughput being 30 pcs per day as an example, ion chromatography and metrology are used to analyze a time-varying relation between the contents of ions such as ammonium ions of the etchant in wet etching that is not improved, and results are as shown in FIG. 7. The pH meter is used to determine pH of the etchant in wet etching that is not improved at different treatment time periods (the wafer throughput increases over time), and results are as shown in FIG. 8. FIG. 7 and FIG. 8 show that pH of the etchant in wet etching that is not improved decreases with the increase of treatment time. The weight percentage of ammonium ions decreases significantly with the increase of the treatment time. After 24 hours of the treatment time, pH of the etchant has dropped by more than 0.5, and the weight percentage of the ammonium ions is only 50% of an initial value. This indicates that the $NH_4F$ of the BOE is rapidly decomposed in the etching reaction chamber, resulting in greater and greater hydrogen ion concentration and fluorine ion concentration of the BOE reaction solution and drop of pH. Recycling of the BOE reaction solution causes the hydrogen ion concentration and the fluorine ion concentration of the etchant in the etchant supply mechanism 2 to be greater and greater and the pH value to be dropped. The wafer throughput is further increased, so as to analyze a relationship between an etch amount and the wafer throughput. Results are as shown in FIG. 4. FIG. 4 shows that the etch amount in the wet etching (when purified water is not injected to the etchant supply mechanism 2 according to a change range of pH of the etchant) increases as the wafer throughput increases. When the wafer throughput exceeds 20 pcs, the etch amount rapidly increases with the increase of the wafer throughput. The etching rate linearly increases ($R^2=0.9933$, close to 1) at a higher increase speed. In order to control the etching rate, the BOE needs to be replaced by a fresh one in time.

A method for improving an etching rate of wet etching is provided by the disclosure. Combined with FIG. 1, this method is used in an etching reaction chamber 100 for etching work. The etching reaction chamber 100 is connected with an etchant supply mechanism 2. The etchant supply mechanism 2 is connected with a purified water supply mechanism 3. The purified water supply mechanism 3 injects purified water into the etchant supply mechanism 2 according to a change range of pH of the etchant in the etchant supply mechanism 2 to ensure that a hydrogen ion concentration and a fluoride ion concentration of the etchant in the etchant supply mechanism 2 are stable. Therefore, it is ensured that pH of the etchant in the etchant supply mechanism 2 and pH of the etchant entering the etchant reaction chamber 100 are stabilized in a controllable range, and the hydrogen ion concentration and the fluoride ion concentration of the etchant in the etching reaction chamber 100 are reduced. The etching rate is controlled within a controllable range, and the technical problem that the etching rate of wet etching increases as the wafer throughput increases is relieved.

The etchant is transported to the etching reaction chamber 100 by the etchant supply mechanism 2. An etching reaction solution in the etching reaction chamber 100 is returned to the etchant supply mechanism 2 through a backflow pipeline after a reaction is completed.

Further, the purified water is injected into the etchant supply mechanism 2 by the purified water supply mechanism 3 according to a drop value of pH of the etchant in the etchant supply mechanism 2. Specifically, when pH of the etchant in the etchant supply mechanism 2 is dropped by more than 0.5, the purified water supply mechanism 3 injects the purified water to the etchant supply mechanism 2. When pH of the etchant in the etchant supply mechanism 2 is dropped by less than 0.5, the purified water supply mechanism 3 stops injecting the purified water to the etchant supply mechanism 2.

Specifically, in this example, the etchant supply mechanism 2 includes an etchant storage chamber 4, and the purified water supply mechanism 3 includes a solenoid valve 5 and a pH meter 7 which are connected to the etchant storage chamber 4. The solenoid valve 5 and the pH meter 7 are respectively connected to a controller 6, and the controller 6 is used to control the solenoid valve 5 to be opened and closed. When the solenoid valve 5 is opened, the purified water is injected into the etchant storage chamber 4. The pH meter 7 is located on a pipeline that supplies the etchant to the etching reaction chamber 100 from the etchant storage chamber 4.

Figure 2:
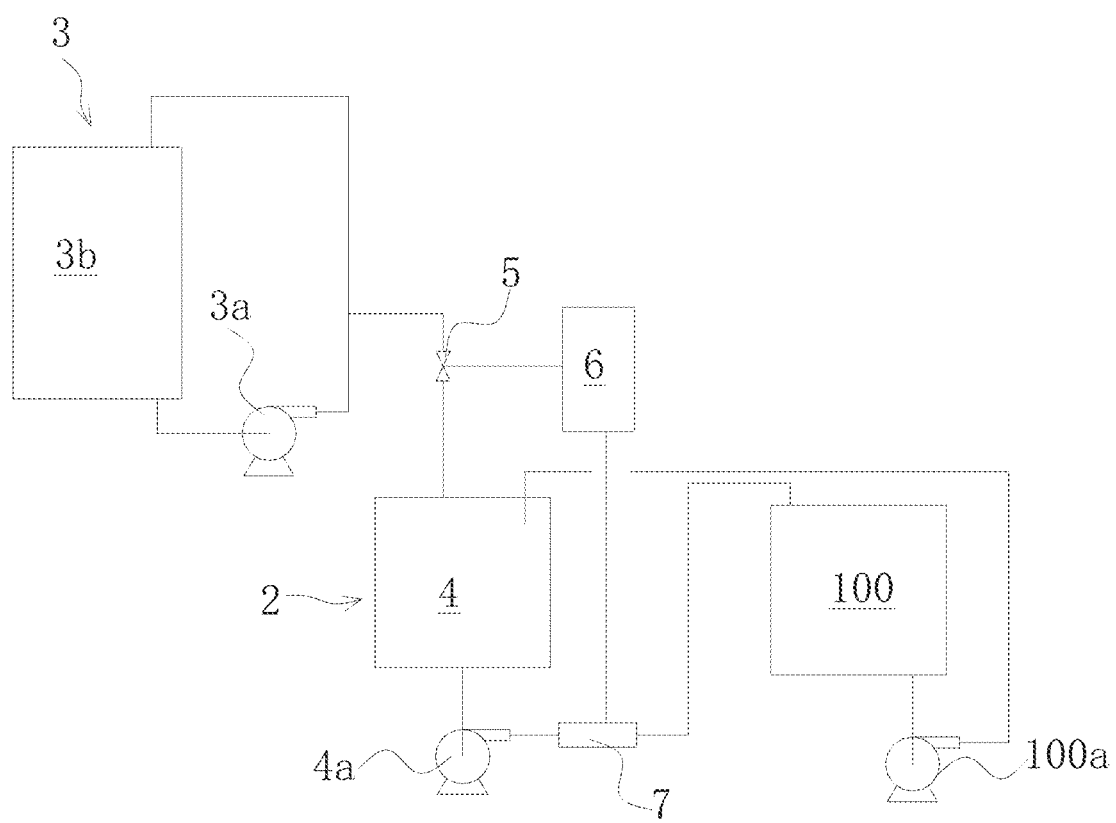
FIG. 2 schematically illustrates another structure of a device used in a method for improving an etching rate of wet etching of the present disclosure.

As shown in FIG. 2, the purified water supply mechanism 3 includes a purified water tank 3b. The purified water tank 3b is connected to the etchant storage chamber 4 through the solenoid valve 5. The solenoid valve 5 is connected to the pH meter 7 through the controller 6. The pH value determined by the pH meter 7 can represent a typical pH in the etchant storage chamber 4.

Those skilled in the art should understand that the purified water tank 3b can be a high-level tank, so that when the solenoid valve 5 is opened, water can be directly added to the etchant storage chamber 4. Alternatively, the purified water tank 3b can be connected to the solenoid valve 5 through a circulating pump 3a, and the circulating pump 3a is used to provide power for water supplementation. As shown in FIG. 2, the circulating pump 3a is connected to the purified water tank 3b. An outlet of the circulating pump 3a is divided into two paths. One path is connected to the solenoid valve 5, and the other path is connected to a top of the purified water tank 3b. The circulating pump 3a is always working. When the solenoid valve 5 is opened, purified water enters the etchant storage chamber 4; and when the solenoid valve 5 is closed, the circulating pump 3a provides internal circulation for the purified water.

The etchant storage chamber 4 is connected to the etching reaction chamber 100 through an etchant delivery pump 4a, and the etching reaction chamber 100 is connected to the etchant storage chamber 4 through a backflow pump 100a, so that the etching reaction solution produced after the etchant etches a wafer in the etching reaction chamber 100 flows back into the etchant storage chamber 4 after passing through the backflow pump 100a, forming one circulation.

Figure 3:
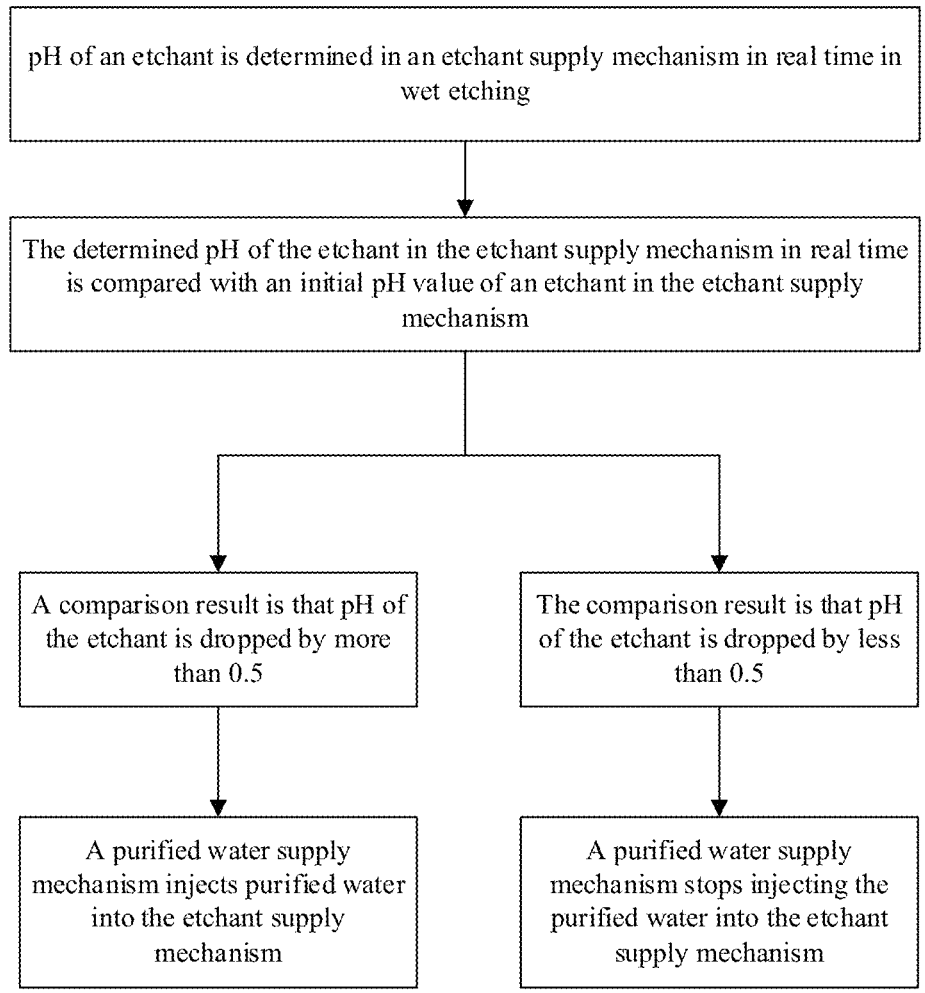
FIG. 3 illustrates a flowchart of a method for improving an etching rate of wet etching of the present disclosure.

As shown in FIG. 3, in the present disclosure, pH of the etchant in the etchant supply mechanism 2 are determined in real time in the wet etching process, and then the determined pH in real-time of the etchant in the etchant supply mechanism 2 is compared with the initial pH of the etchant in the etchant supply mechanism 2. When the comparison result is that pH of the etchant is dropped by more than 0.5, the purified water supply mechanism 3 injects the purified water into the etchant supply mechanism 2. When the comparison result is that pH of the etchant is dropped by less than 0.5, the purified water supply mechanism 3 stops injecting the purified water into the etchant supply mechanism 2.

Specifically, pH of the etchant is determined by the pH meter 7 online in real time, and is input to the controller 6. The controller 6 compares pH of the etchant determined by the pH meter 7 with the initial pH value of the etchant. When the comparison result is that pH of the etchant is dropped by more than 0.5, the controller 6 controls the solenoid valve 5 to be opened, and the purified water is injected into the etchant storage chamber 4 to dilute the hydrogen ion concentration and the fluorine ion concentration in the etchant storage chamber 4. The pH meter 7 continues to detect pH of the etchant online in real time, and the pH value is input to the controller 6. The controller 6 compares pH of the etchant determined by the pH meter 7 with the initial pH value of the etchant. When the comparison result is that pH value of the etchant is dropped by less than 0.5, the controller 6 controls the solenoid valve 5 to be closed, and the purified water supply mechanism 3 stops injecting the purified water into the etchant storage chamber 4. At this time, the hydrogen ion concentration and the fluorine ion concentration in the etchant storage chamber 4 tend to be stable. pH of the etchant in the etchant storage chamber 4 and the pH of the etchant entering the etching reaction chamber 100 are stabilized in a controllable range, which ensures that the etching rate is in a controllable range and improves the technical problem that the etching rate gradually increases as the wafer throughput increases.

Figure 5:
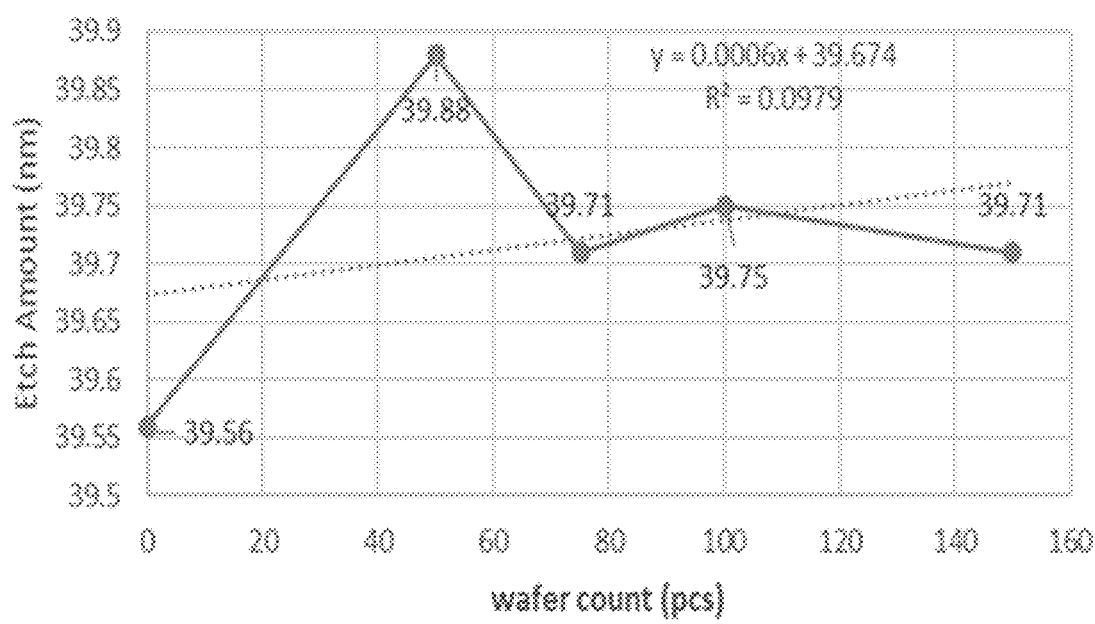
FIG. 5 illustrates a relationship between an etching rate and the wafer throughput of wet etching that is improved by the method of the present disclosure.

As shown in FIG. 5, when purified water is injected into the etchant supply mechanism 2 according to the change range of pH of the etchant, the etching rate decreases and remains in a relatively stable range.

Using wet etching that is improved by the present disclosure, and gradually increasing the wafer throughput, a relationship between the etch amount and the wafer throughput is analyzed. Results are as shown in FIG. 5. FIG. 5 shows in the method (whether to inject purified water into the etchant supply mechanism 2 according to the change range of pH of the etchant) for improving an etching rate of wet etching of the disclosure, the etch amount does not change much with the increase of the wafer throughput and remains in the controllable range of 39.56 nm-39.88 nm. The linear dashed line ($R^2$=0.0979) after data fitting in the solid line in FIG. 5 shows the etch amount and the wafer throughput do not have a linear relation. The method for improving wet etching of the disclosure can control the etching rate without replacing BOE in a short time, significantly reducing chemical consumption, reducing production costs, avoiding frequent shutdown, and improving industrial production efficiency.

Figure 6:
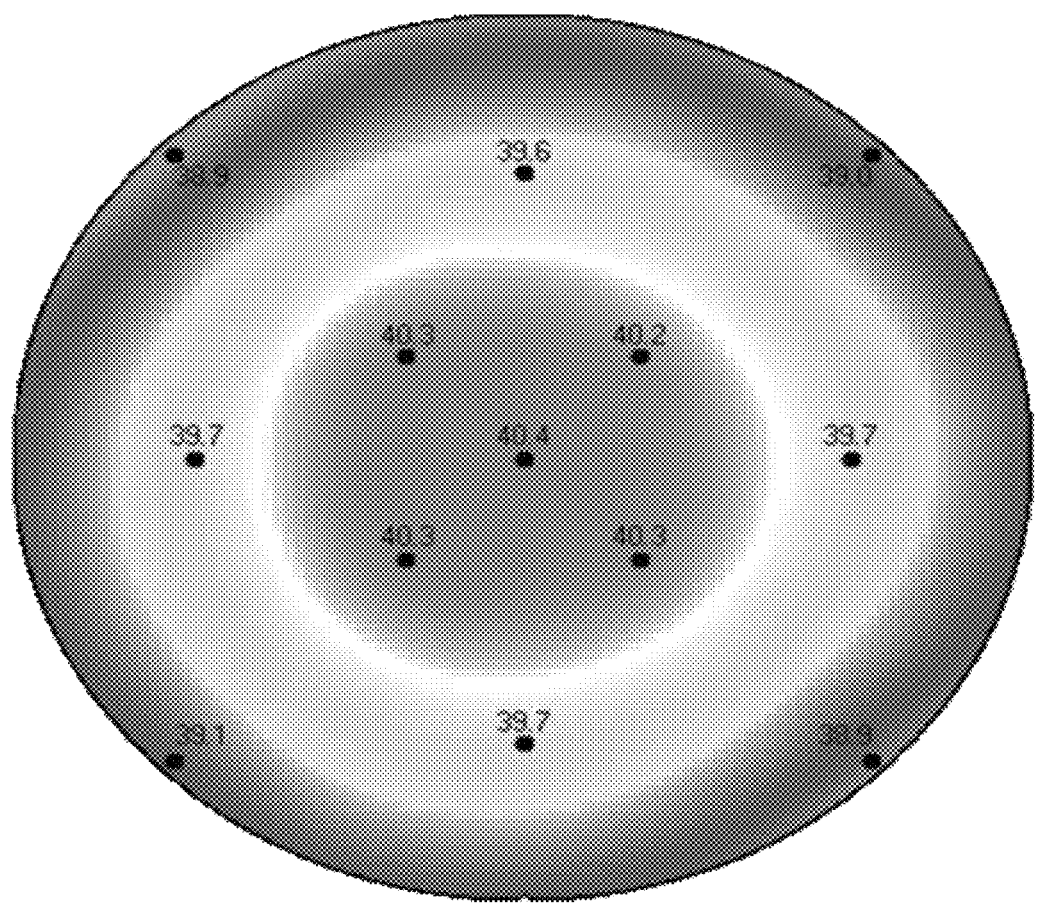
FIG. 6 illustrates a relationship among etching rates and light with different wavelengths.

An illumination light source in the etching reaction chamber 100 is in type of long-wavelength light. Specifically, the illumination light source in the etching reaction chamber 100 is yellow light with a wavelength of 570 nm-590 nm. Yellow light can be a commercially available yellow light source, or the light source can be filtered through a yellow filter. As shown in FIG. 6, a relationship among the etching rate and a wavelength of the light source is illustrated. According to a test, when short-wave wavelength light at the middle of the wafer is used as the illumination light source, and the long-wavelength light at periphery of the wafer is used as the illumination light source, an etched thin film thickness at the middle of the wafer is greater than an etched thin film thickness around the wafer. As shown in FIG. 6, the etch amount at the middle of the wafer is 40.2 nm-40.4 nm, and the etch amount at periphery of the wafer is 39.1 nm-39.7 nm, indicating the shorter the wavelength of the light source used in the etching process, the higher the etching rate. It can be seen that the short-wavelength light with high energy may accelerate the decomposition of the $NH_4F$, and the illumination light source in the etching reaction chamber 100 is changed to long-wavelength light, which reduces the illumination energy and can partially inhibit the decomposition of the $NH_4F$. In addition, the formation of OH— in the etchant in the etchant supply mechanism 2 can be further reduced, thereby during wet etching, avoiding corrosion of Si, reducing water consumption, improving the problem that the hydrogen ion concentration and the fluorine ion concentration of the etchant in the etchant supply mechanism 2 increase as the wafer throughput increases, and ensuring the stability of the etching rate of the wet etching.

Compared with the related art, various embodiments of the present disclosure can have one or more the following advantages.

The purified water supply mechanism and the pH meter are equipped. The pH meter is used to determine pH of the etchant in the etchant supply mechanism. The purified water supply mechanism is used to inject the purified water into the etchant supply mechanism according to the change range of pH of the etchant in the etchant supply mechanism to ensure that the hydrogen ion concentration and the fluoride ion concentration of the etchant in the etchant supply mechanism are stable. Therefore, it is ensured that the hydrogen ion concentration and the fluorine ion concentration of the etchant entering the etching reaction chamber are stable, the etching rate is controlled, and the problem of rise of the etching rate is overcome.

The illumination system inside the etching reaction chamber is changed to long-wavelength light (preferably yellow light) to reduce the light energy, partially inhibit the decomposition of $NH_4F$, prevent ionization from generating excessive hydrogen ions and fluoride ions, and further reduce the formation of $OH^-$ in the etchant in the etchant supply mechanism, thereby avoiding the phenomenon that Si is corroded during wet etching, which consumes excessive water, causing the hydrogen ion concentration and the fluorine ion concentration of the etchant in the etchant supply mechanism to increase with the increase of the wafer throughput, thus affecting the etching rate.

The specific embodiments described herein are only for illustration of the spirit of the present disclosure. Those skilled in the art of the present disclosure can make a variety of modifications or supplementations to the described specific embodiments, or substitute the described specific embodiments by similar methods without departing from the spirit of the present disclosure.

What is claimed is:

1. A method for improving an etching rate of wet etching used in an etching reaction chamber for etching work, the etching reaction chamber being connected with an etchant supply mechanism, the etchant supply mechanism being connected with a water supply mechanism, comprising:
    injecting water into the etchant supply mechanism by the water supply mechanism according to a change range of pH of an etchant in the etchant supply mechanism to ensure that a hydrogen ion concentration and a fluoride ion concentration of the etchant in the etchant supply mechanism are stable;
    wherein
    the etchant is composed of water, ammonium fluoride, hydrogen fluoride, and a surfactant; and
    illuminating in the etching reaction chamber with yellow light having a wavelength of 570 nm-590 nm.

2. The method for improving the etching rate of wet etching according to claim 1, wherein the injection of the water into the etchant supply mechanism by the water supply mechanism is according to a drop of pH of the etchant in the etchant supply mechanism.

3. The method for improving the etching rate of wet etching according to claim 2, wherein when pH of the etchant in the etchant supply mechanism is dropped by more than 0.5, the water supply mechanism injects the water into the etchant supply mechanism; and
    when pH of the etchant in the etchant supply mechanism is dropped by less than 0.5, the water supply mechanism stops injecting the water to the etchant supply mechanism.

4. The method for improving the etching rate of wet etching according to claim 3, wherein the etchant supply mechanism comprises an etchant storage chamber, and the water supply mechanism comprises a solenoid valve and a pH meter which are connected to the etchant storage chamber;
    the solenoid valve and the pH meter are respectively connected to a controller, and the controller is used to control the solenoid valve to be opened and closed; and
    when the solenoid valve is opened, the water is injected into the etchant storage chamber.

5. The method for improving the etching rate of wet etching according to claim 4, wherein the pH meter is located on a pipeline that supplies the etchant to the etching reaction chamber from the etchant storage chamber.

6. The method for improving the etching rate of wet etching according to claim 4, further comprising:
    inputting pH of the etchant determined by the pH meter to the controller, and comparing pH of the etchant determined by the pH meter with an initial pH value of the etchant by the controller;
    when a comparison result is that pH of the etchant is dropped by more than 0.5, the controller controls the solenoid valve to be opened, and the water is injected into the etchant storage chamber to dilute the hydrogen ion concentration and fluoride ion concentration in the etchant storage chamber; and
    when the comparison result is that pH of the etchant is dropped by less than 0.5, the controller controls the solenoid valve to be closed, and the water supply mechanism stops injecting the water into the etchant storage chamber.

7. The method for improving the etching rate of wet etching according to claim 4, wherein the etchant storage chamber is connected to the etching reaction chamber through an etchant delivery pump, and the etching reaction chamber is connected to the etchant storage chamber through a backflow pump, so that the etching solution produced after the etchant etches a wafer in the etching reaction chamber, flows back into the etchant storage chamber after passing through the backflow pump.

8. The method for improving the etching rate of wet etching according to claim 1, wherein ammonium fluoride in the etchant is 19.7%-20.3% by weight percentage, and hydrogen fluoride in the etchant is 3.8%-4.2% by weight percentage.

9. The method for improving the etching rate of wet etching according to claim 1, wherein the surfactant is selected from one or more of an alkyl sulfonic acid surfactant, a fluorohydroalkyl carboxylic acid surfactant, a fluorine-containing carboxylic acid surfactant or a fluorinated carboxylate surfactant.

10. The method for improving the etching rate of wet etching according to claim 1, wherein
    the water supply mechanism comprises a water tank, and the water tank is connected to the etchant storage chamber through the solenoid valve; and
    the solenoid valve is connected to the pH meter through the controller, so that pH value determined by the pH meter represents pH in the etchant storage chamber.

11. The method for improving the etching rate of wet etching according to claim 10, wherein the water tank is a high-level tank, so that when the solenoid valve is opened, and the water is directly added to the etchant storage chamber.

12. The method for improving the etching rate of wet etching according to claim 10, wherein the water tank is connected to the solenoid valve through a circulating pump, and the circulating pump is used to provide power for water supplementation.

13. The method for improving the etching rate of wet etching according to claim 12, wherein an outlet of the circulating pump is divided into two paths,
  wherein one path of the two paths is connected to the solenoid valve, and other path of the two paths is connected to a top of the water tank.

* * * * *